(12) United States Patent
Beausoleil et al.

(10) Patent No.: US 7,089,538 B1
(45) Date of Patent: Aug. 8, 2006

(54) HIGH SPEED SOFTWARE DRIVEN EMULATOR COMPRISED OF A PLURALITY OF EMULATION PROCESSORS WITH A METHOD TO ALLOW MEMORY READ/WRITES WITHOUT INTERRUPTING THE EMULATION

(75) Inventors: William F. Beausoleil, Hopewell Junction, NY (US); R. Bryan Cook, Poughkeepsie, NY (US); Tak-kwong Ng, Hyde Park, NY (US); Helmut Roth, Hopewell Junction, NY (US); Peter Tannenbaum, Woodstock, NY (US); Lawrence A. Thomas, West Hurley, NY (US); Norton J. Tomassetti, Kingston, NY (US)

(73) Assignee: Quicktum Design Systems, Inc., San Jose, CA (US)

( * ) Notice: Subject to any disclaimer, the term of this patent is extended or adjusted under 35 U.S.C. 154(b) by 332 days.

(21) Appl. No.: 09/655,596

(22) Filed: Sep. 6, 2000

(51) Int. Cl.
*G06F 9/44* (2006.01)

(52) U.S. Cl. .................................... 717/134

(58) Field of Classification Search .................. 716/4, 716/5; 703/13–14, 23–28; 717/124–138, 717/151–161, 149; 711/163, 164, 108, 152, 711/202; 712/216–228, 19–20; 710/100, 710/107, 200, 242
See application file for complete search history.

(56) References Cited

U.S. PATENT DOCUMENTS

| | | | | | |
|---|---|---|---|---|---|
| 4,044,334 | A | * | 8/1977 | Bachman et al. | 707/102 |
| 4,084,224 | A | * | 4/1978 | Appell et al. | 718/100 |
| 4,414,624 | A | * | 11/1983 | Summer et al. | 712/21 |
| 4,545,053 | A | * | 10/1985 | Raamot | 370/369 |
| 4,701,845 | A | * | 10/1987 | Andreasen et al. | 714/31 |
| 4,885,684 | A | * | 12/1989 | Austin et al. | 717/149 |
| 5,551,013 | A | * | 8/1996 | Beausoleil et al. | 703/23 |
| 5,701,502 | A | * | 12/1997 | Baker et al. | 709/201 |
| 5,911,059 | A | * | 6/1999 | Profit, Jr. | 703/23 |
| 6,151,689 | A | * | 11/2000 | Garcia et al. | 714/49 |
| 6,173,386 | B1 | * | 1/2001 | Key et al. | 712/10 |
| 6,480,952 | B1 | * | 11/2002 | Gorishek et al. | 712/227 |
| 6,522,985 | B1 | * | 2/2003 | Swoboda et al. | 702/117 |
| 6,529,983 | B1 | * | 3/2003 | Marshall et al. | 710/200 |

* cited by examiner

*Primary Examiner*—Kakali Chaki
*Assistant Examiner*—Tuan Anh Vu
(74) *Attorney, Agent, or Firm*—Orrick Herrington & Sutcliffe, LLP

(57) ABSTRACT

A software driven emulator in which the stored emulation program for a processor module is compiled to include a code bit or bits in the emulation instruction step sequence that is decoded as main data memory disable command. Thus, once in each emulation program cycle, the memory controller disables the main data memories on the module, and allows the maintenance bus to read or write data to these memories.

4 Claims, 2 Drawing Sheets

HIGH SPEED SOFTWARE DRIVEN EMULATOR COMPRISED OF A PLURALITY OF EMULATION PROCESSORS WITH A METHOD TO ALLOW MEMORY READ/WRITES WITHOUT INTERRUPTING THE EMULATION

CROSS REFERENCE TO RELATED APPLICATIONS

The following copending applications, assigned to the assignee of the present invention, contain common disclosure and are incorporated herein by reference in their entireties:

"High Speed Software Driven Emulator Comprised of a Plurality of Emulation Processors with Improved Board-to-Board Interconnection Cable Length Identification System," Ser. No. 09/655,595, filed Sep. 6, 2000.

"High speed software Driven Emulator Comprised of a Plurality of Emulation Processors with an Improved Maintenance Bus that Streams Data at High speed," Ser. No. 09/654,147, now issued as U.S. Pat. No. 6,850,880.

"High speed software Driven Emulator Comprised of a Plurality of Emulation Processors with a Method to Allow High Speed Bulk Read/write Operation Synchronous DRAM While Refreshing the Memory," Ser. No. 09/656,541, now issued as U.S. Pat. No. 6,901,359.

"High Speed Software Driven Emulator Comprised of a Plurality of Emulation Processors with Improved Multiplexed Data Memory," Ser. No. 09/522,354, now issued as U.S. Pat. No. 6,832,185.

FIELD OF THE INVENTION

This invention relates to software driven emulators in which a large number of processors operate in parallel to emulate complex logical functions, and more particularly, to a system and method for managing the memory arrays of such emulators so that memory data transfers can be executed without interrupting the emulation process.

TRADEMARKS

S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

The usefulness of software driven emulators has increased enormously with growth in the complexity of integrated circuits. Basically, an emulation engine operates to mimic the logical design of a set of one or more integrated circuit chips. The emulation of these chips in terms of their logical design is highly desirable for several reasons. The utilization of emulation engines has also grown up with and around the corresponding utilization of design automation tools for the construction and design of integrated circuit chip devices. In particular, as part of the input for the design automation process, logic descriptions of the desired circuit chip functions are provided. The existence of such software tools for processing these descriptions in the design process is well suited to the utilization of emulation engines which are electrically configured to duplicate the same logic function that is provided by a design automation tool.

Utilization of emulation devices permits testing and verification via electrical circuits of logic designs before these designs are committed to a socalled "silicon foundry" for manufacture. The input to such foundries is the functional logic description required for the chip and its output is initially a set of photolithographic masks which are then used in the manufacture of the desired electrical circuit chip device. Verifying that logic designs are correct in the early stage of chip manufacturing eliminates the need for costly and time-consuming second passes through a silicon foundry.

Another advantage of emulation systems is that they provide a device that makes possible the early validation of software meant to operate the emulated chips. Thus, software can be designed, evaluated and tested well before the time when actual circuit chips become available. Additionally, emulation systems can also operate as simulator-accelerator devices thus providing a high-speed simulation platform.

Emulation engines of the type contemplated by this invention contain an interconnected array of emulation processors (EP). Each emulation processor (hereinafter also sometimes simply referred to as "processor") can be programmed to evaluate logic functions (for example, AND, OR, XOR, NOT, NOR, NAND, etc.). The program driven processors operate together as an interconnected unit, emulate the entire desired logic design. However, as integrated circuit designs grow in size, more emulation processors are required to accomplish the emulation task. An aim, therefore, is to increase the capacity of emulation engines in order to meet the increasingly difficult task of emulating more and more complex circuits and logic functions by increasing the number of emulation processors in each of its modules.

For purposes of better understanding the structure and operation of emulation devices generally, and this invention particularly, U.S. Pat. No. 5,551,013 and patent application Ser. No. 09/373,125 filed Aug. 12, 1999, both of which are assigned to the assignee of this application, are hereby incorporated herein by reference.

U.S. Pat. No. 5,551,013 shows an emulation chip, called a module here, having multiple (e.g. 64) processors. All processors within the module are identical. The sequencer and the interconnection network occur only once in a module. The control stores hold a program created by an emulation compiler for a specified processor. The stacks hold data and inputs previously generated and are addressed by fields in a corresponding control word to locate the bits for input to the logic element. During each step of the sequencer an emulation processor emulates a logic function according to the emulation program. The data flow control interprets the current control word to route and latch data within the processor. The node-bit-out signal from a specified processor is presented to the interconnection network where it is distributed to each of the multiplexers (one for each processor) of the module. The node address field in the control word allows a specified processor to select for its node-bit-in signal the node-bit-out signal from any of the processors within its module. The node bit is stored in the input stack on every step. During any operation, the node-bit-out signal of a specified processor may be accessed by none, one, or all of the processors within the module.

Data routing within each processor's data flow and through the interconnection network occurs independently of and overlaps the execution of the logic emulation function in each processor. Each control store stores control words executed sequentially under control of the sequencer and program steps in the associated module. Each revolution of the sequencer causes the step value to advance from zero to a predetermined maximum value and corresponds to one target clock cycle for the emulated design. A control word in the control store is simultaneously selected during each step of the sequencer. A logic function operation is defined by each control word.

Each of these emulation processors has an execution unit for processing multiple types of logic gate functions. Each emulation processor switches from a specified one logic gate function to a next logic gate function in a switched-emulation sequence of different gate functions. The switched-emulation sequence of each of the processors thus can emulate a subset of gates in a hardware arrangement in which gates are of any type that the emulation processors functionally represent for a sequence of clock cycles. The processors are coupled by a like number of multiplexers having outputs respectively connected to the emulation processors of a module and having inputs respectively connected to each of the other emulation processors. The bus connected to the multiplexers enables an output from any emulation processor to be transferred to an input of any other of the emulation processors. In accordance with the teachings of the pending application, the basic design of the U.S. Pat. No. 5,551,013 is improved by interconnecting processors into clusters. With the processors cascaded, all processors in a cluster perform the setup and storing of results in parallel. This setup includes routing of the data through multiple evaluation units for the evaluation phase. For most efficient operation, the input stack and data stack of each processor must be stored in shared memory within each cluster. Then, all processors perform the storage phase, again in parallel. The net result is multiple cascaded evaluations performed in a single emulation step. Every processor in a cluster can access the input and data stacks of every other processor in the cluster and less space on each module chip for the functions that support the processor operation, particularly the memory functions.

The ET4 emulator can be partitioned so that the emulator is capable of running more than one emulation at a time. To fully exploit this capability, there is a need to read from and write to the "main data memories". Each module has a main data memory, comprised of two commercially available Sync DRAMs and one commercially available SSRAM. Each emulator board is comprised of sixty-five modules and a memory controller serves all modules on a board. In prior art emulators of the type contemplated by this invention, an emulation process is stopped in order to read or write data to a main module memory from a source external to the emulation process.

SUMMARY OF THE INVENTION

An object of this invention is the provision of a method that enables transfers of external data to and from a module's main data memories without interrupting emulation in progress.

Briefly, this invention contemplates the provision of a software driven emulator in which the stored emulation program for a processor module is compiled to include a code bit or bits in the emulation instruction step sequence that is decoded as main data memory disable command. Thus, once in each emulation program cycle, the memory controller disables the main data memories on the module, and allows the maintenance bus to read or write data to these memories.

BRIEF DESCRIPTION OF THE DRAWINGS

The foregoing and other features and advantages of the invention will be described with reference to the accompanying drawings. In the drawings, like reference numbers generally indicate identical, functionally similar, and/or structurally similar elements. Also in the figures, the left most digit of each reference number corresponds to the figure in which the reference number is first used.

DETAILED DESCRIPTION OF THE INVENTION

Figure 1:
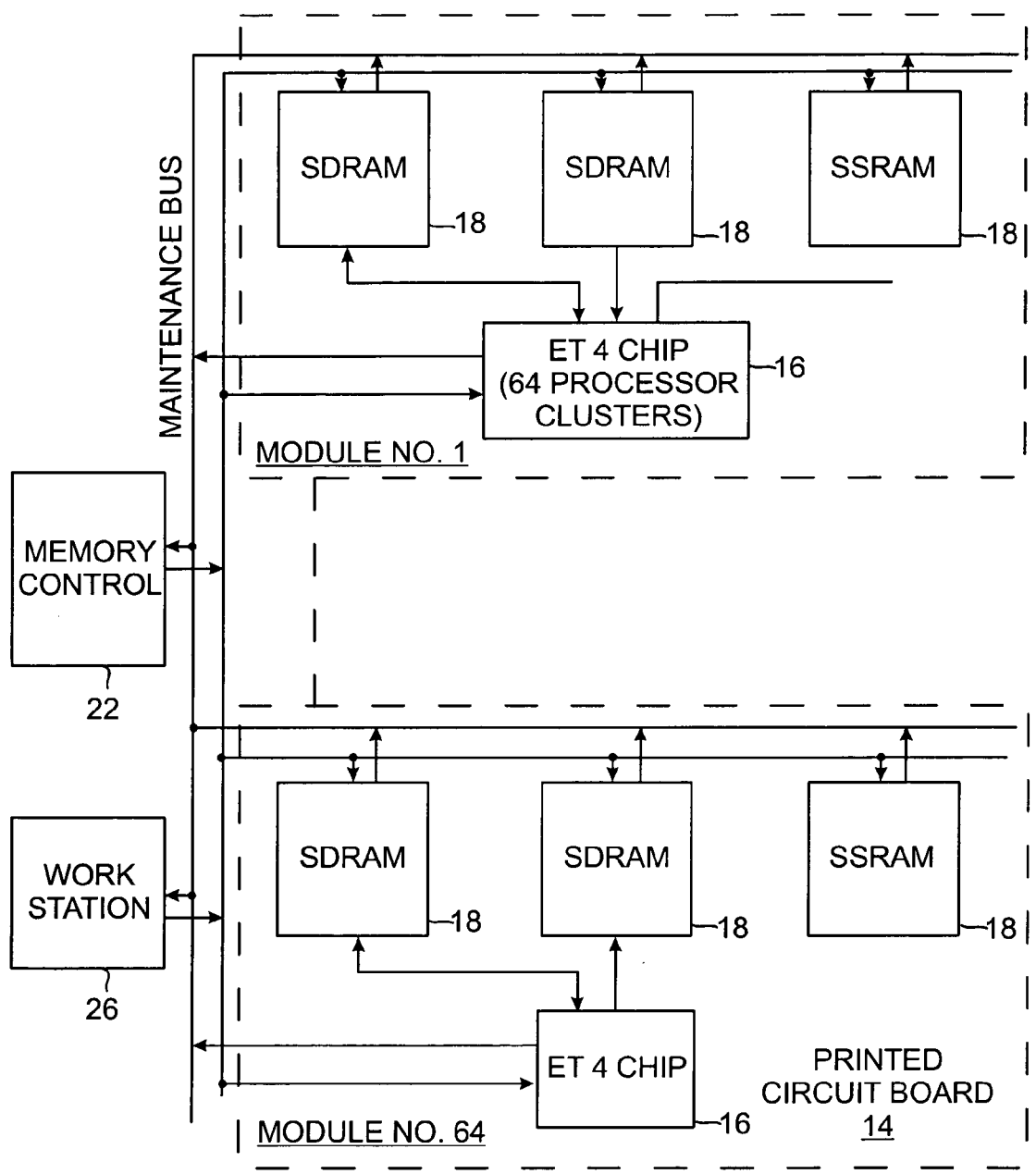
FIG. 1 is a high level block diagram of two of the modules on a printed circuit board of the type to which this invention is applicable.

Referring now to FIG. 1, an emulator of the type contemplated by this invention is comprised of a number of printed circuit boards 14 interconnected by a maintenance bus, which also connects each board to a work station 26. Work station 26 serves, among other functions, to load data to the emulator memories, and receive data from the emulator memories. Each printed circuit board has a memory controller 22, which provides a memory control interface function for the modules on a printed circuit board. Each module (only two are illustrated in FIG. 1) includes a processor chip 16 (ET4) and three RAM chips 18 (two SDRAMs and one SSRAM), which are coupled to the ET4 processor 16. Each ET4 chip is comprised of sixty-four one-bit processors.

Figure 2:
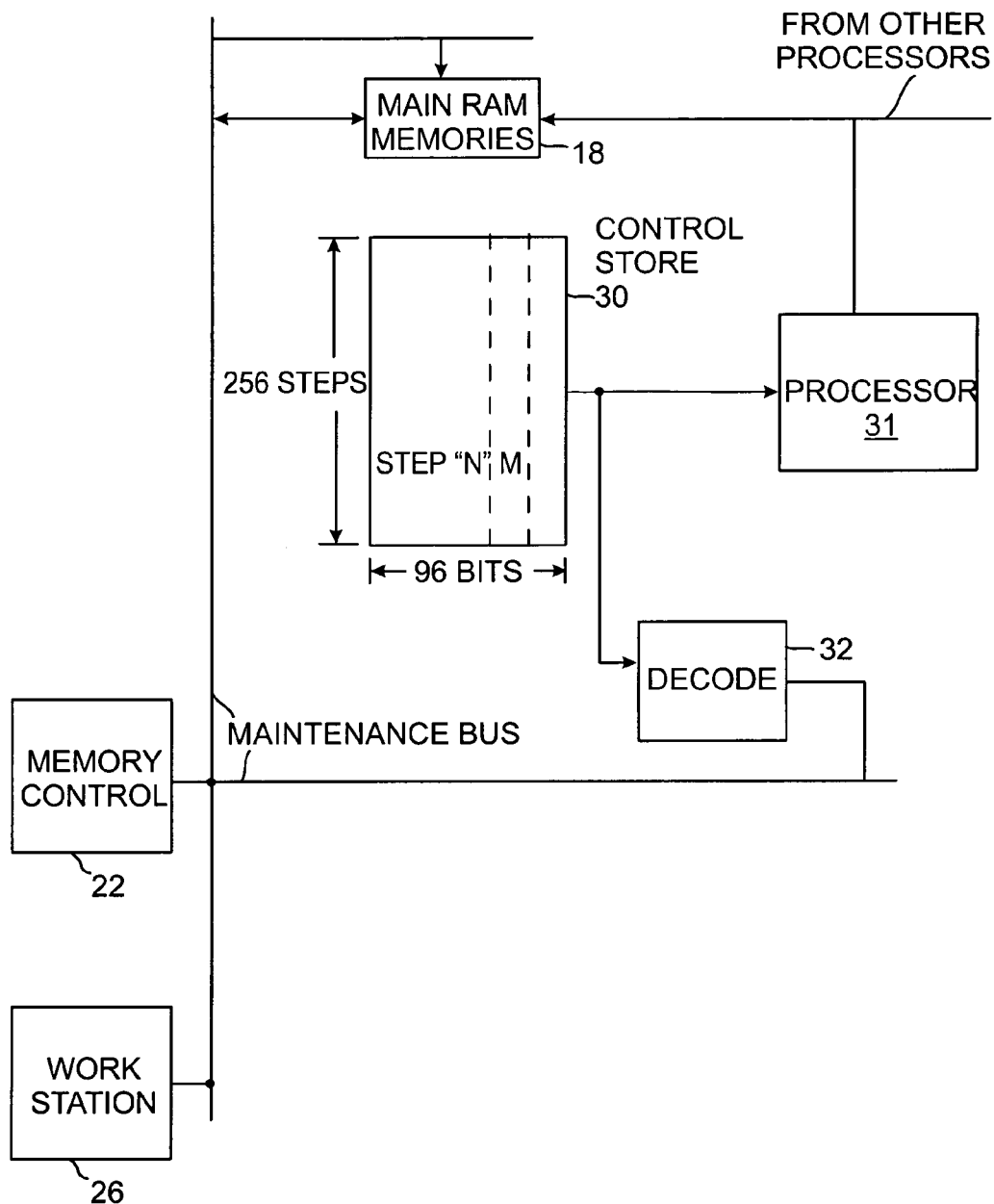
FIG. 2 is a logic block diagram illustrating the system for reading and/or writing to the main module memories without interrupting the emulation process in accordance with the teachings of this invention.

Referring now to FIG. 2 as well the preceding figure, each of the 64 processors in the module includes a control store 30, which in this illustrative embodiment is 256 steps deep with 96 bits wide processor control codes that determine the logic function of the associated processor 31 during that step in the emulation process. As will be appreciated by those skilled in the art, in carrying out an emulation, a compiler program compiles the logic design as a series of processor instruction steps that are stored in the control store 30 of each processor in a module. In accordance with the teaching of this invention, in order to allow reading and/or writing to the RAM memories of a module, the control store program in one of the control store memories 30 is compiled so that it has a bit in a bit location that is decoded as command to memory controller 22 to disable all module processors from writing to or reading from the module RAM memories 18. As illustrated in FIG. 2, bit "M" in step "N" is set to a predetermined binary value ("0" or "1"), decoder 33 decodes the state of bit "M" in step "N" and sends a disable command to memory controller 22 over the maintenance bus. This allows work station 22 to transfer data to or from the module's RAM memories 18 during this step in each cycle of control store 30. When the program progresses to the next step, the disable command terminates and the processors are again enabled for data transfer to and from the RAMs. Of course, the program cold be compiled and decoded to provide two or more interrupts each cycle of the control store.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. In an emulation engine comprised of a plurality of modules, a work station external to the plurality of modules, and a maintenance bus for transferring data between the work station and said modules, each of said modules including a plurality of module processors and a module main memory unit accessible for data transfers during an emulation by each of said plurality of processors, each of said processors having a control store to store a programmable sequence of emulation steps that define logic states for its processor, wherein the module main memory unit is separate from the control store, a method to allow data transfers between said module main memory unit and said work station without interrupting an in progress emulation, comprising:

compiling said programmable sequence of emulation steps to include, in at least one step, a blocking code that is decoded, when the step is read from the control store, as a disable command between the plurality of module processors and said module main memory;

decoding said blocking code and, in response thereto, blocking transfers between the plurality of module processors and said module main memory; and transferring data between said work station and said module main memory while transfers between the plurality of module processors and said module main memory are blocked, wherein said blocking code blocks data transfers between said plurality of module processors and said module main memory during the emulation step that includes the blocking code thereby allowing data to be transferred between said work station and said module main memory during the in progress emulation.

2. A method to allow data transfers between said module main memory unit and said work station as in claim 1 further comprising unblocking transfers between the plurality of module processors and said module main memory when the decoding step is next in the sequence after said step that includes said blocking code.

3. A method to allow data transfers between said module main memory unit and said work station as in claim 2 wherein said programmable sequence is repeated and said decoding and transferring steps are repeated with each repetition of said programmable sequence.

4. A method to allow data transfers between said module main memory unit and said work station as in claim 1 wherein said programmable sequence is repeated and said decoding and transferring steps are repeated with each repetition of said programmable sequence.

* * * * *

UNITED STATES PATENT AND TRADEMARK OFFICE
CERTIFICATE OF CORRECTION

| | | |
|---|---|---|
| PATENT NO. | : 7,089,538 B1 | |
| APPLICATION NO. | : 09/655596 | |
| DATED | : August 8, 2006 | |
| INVENTOR(S) | : William F. Beausoleil et al. | |

It is certified that error appears in the above-identified patent and that said Letters Patent is hereby corrected as shown below:

On Title Page
IN THE ASSIGNEE

On page 1 Item (73) delete the word "QUICKTUM" and insert therefor the word --QUICKTURN--.

Signed and Sealed this

Tenth Day of April, 2007

JON W. DUDAS
*Director of the United States Patent and Trademark Office*